US011706881B2

(12) United States Patent
Kim

(10) Patent No.: US 11,706,881 B2
(45) Date of Patent: Jul. 18, 2023

(54) FLEXIBLE DISPLAY MODULE HOUSING

(71) Applicant: Jung Young Kim, Ulsan (KR)

(72) Inventor: Jung Young Kim, Ulsan (KR)

( * ) Notice: Subject to any disclaimer, the term of this patent is extended or adjusted under 35 U.S.C. 154(b) by 0 days.

(21) Appl. No.: 17/535,653

(22) Filed: Nov. 25, 2021

(65) Prior Publication Data

US 2023/0164929 A1 May 25, 2023

(51) Int. Cl.
*H05K 5/00* (2006.01)
*H05K 5/02* (2006.01)

(52) U.S. Cl.
CPC ......... *H05K 5/0017* (2013.01); *H05K 5/0204* (2013.01)

(58) Field of Classification Search
None
See application file for complete search history.

(56) References Cited

U.S. PATENT DOCUMENTS

| 9,513,665 | B2 * | 12/2016 | Magi | G06F 3/0416 |
| 2016/0095232 | A1 * | 3/2016 | Zhang | G06F 1/1652 |
| | | | | 361/807 |
| 2016/0124395 | A1 | 5/2016 | Lee | |
| 2016/0357158 | A1 * | 12/2016 | Kim | G04G 21/06 |
| 2016/0357222 | A1 * | 12/2016 | Seo | G06F 1/1635 |
| 2018/0039303 | A1 * | 2/2018 | Hashimoto | G06F 1/163 |
| 2019/0305232 | A1 * | 10/2019 | Chen | H01L 51/56 |
| 2020/0221590 | A1 * | 7/2020 | Wang | G06F 1/1652 |

FOREIGN PATENT DOCUMENTS

| CN | 208673635 U | * | 3/2019 | ............ G06F 1/163 |
| KR | 101480675 B1 | | 1/2015 | |
| KR | 20170064959 A | | 6/2017 | |
| KR | 101866507 B1 | | 6/2018 | |
| KR | 20210130474 A | | 11/2021 | |

* cited by examiner

*Primary Examiner* — Xanthia C Cunningham

(74) *Attorney, Agent, or Firm* — STIP Law Group, LLC

(57) ABSTRACT

A flexible display module housing is proposed. The flexible display module housing includes a flexible display module, and an elastic support body joined to a lower surface of the flexible display module and configured to absorb a stress acting on the flexible display module and to restore the flexible display module to an original state of the flexible display module.

8 Claims, 4 Drawing Sheets

Section A-A

FLEXIBLE DISPLAY MODULE HOUSING

BACKGROUND OF THE INVENTION

Field of the Invention

The present disclosure relates to a flexible display module housing configured to be suitable for use on a wrist of a user.

Description of the Related Art

A smartphone is a representative smart terminal and is widely used anywhere in the world.

The smartphone is a representative smart terminal that can transmit and receive messages, voice and video calls, music and movies, and various data communications. Recently, larger liquid crystal displays are being favored as a screen of the smartphone.

As the size of the liquid crystal display is gradually increased, it is difficult for a user to put the large smartphone in a pocket, so the user should put and carry the smartphone in a back pocket or in a bag. Therefore, it is inconvenient to take out the smartphone in every use time, and the risk of loss and damage of a smartphone is high. When the user puts and carries the smartphone in a pocket or a bag, it is difficult to immediately recognize an incoming call or a message.

In order to solve the above-mentioned problems, a smartwatch has been developed and marketed. The smartwatch notifies the time in a worn state on the wrist of the user and is connected to a smartphone in a bag or a pocket through Bluetooth™ to notify the user when an incoming call, a message, or an e-mail is received.

However, the smartwatch is a wearable device worn on the wrist and is limited in the size of the liquid crystal display. Therefore, the smartwatch only displays the time and notifies whether the smartphone has received a call or a message, but the smartwatch is not big enough to search for information or to enjoy visual content such as movies.

Documents of Related Art (Patent Document 1) Korean Patent No. 10-1480675 (registered on Jan. 02, 2015)

SUMMARY OF THE INVENTION

Accordingly, the present disclosure has been made keeping in mind the above problem occurring in the related art, and the present disclosure is intended to provide a flexible display module housing, which is suitable for implementation as a wrist band with a more expanded screen departing from a limited display size provided by a conventional smartwatch.

In order to achieve the above objective, according to one aspect of the present disclosure, there is provided a flexible display module housing including: a flexible display module; and an elastic support body joined to a lower surface of the flexible display module and configured to absorb a stress acting on the flexible display module and to restore the flexible display module to an original state of the flexible display module.

The elastic support body may be elastic plastic, an elastic metal plate, or an elastic complex generated of elastic plastic and an elastic metal plate coupled to each other.

The flexible display module housing may include a flexible pad disposed between the flexible display module and the elastic support body and joined to both the flexible display module and the elastic support body, wherein the flexible pad may include a first flexible pad and a second flexible pad, and as a first uneven portion formed on one surface of the first flexible pad and a second uneven portion formed on one surface of the second flexible pad are fitted into each other, the first flexible pad and the second flexible pad may be engaged with each other.

Relative movement may be possible in a sliding manner on contact surfaces between the first uneven portion and the second uneven portion.

The elastic support body may include: a housing body formed of plastic having elasticity; and an elastic metal plate embedded in a lower portion of a display module accommodating part of the housing body by insertion molding, wherein the flexible display module may be joined to an inside of the display module accommodating part.

According to another aspect of the present disclosure, there is provided a flexible display module housing including: a flexible display module; an elastic support body joined to a lower surface of the flexible display module and configured to absorb a stress acting on the flexible display module and to restore the flexible display module to an original state thereof; and a wrist band including a display module accommodating part accommodating, therein, both the flexible display module and the elastic support body joined to the lower surface of the flexible display module, wherein the wrist band may have coupling parts at opposite ends thereof, and a thickness of a band part connecting the display module accommodating part to the coupling parts may be formed thinner than thicknesses of the display module accommodating part and the coupling parts.

The wrist band may have a trapezoidal shape of which an edge facing the arm is longer than an edge facing the hand.

Rigid components including a rigid circuit board, a rigid battery, a rigid camera, and a rigid antenna may be mounted in areas of the display module accommodating part and the coupling parts, and flexible components including a flexible cable, a flexible circuit board, a flexible battery, and a flexible antenna are mounted in the band part.

A complex of the flexible display module and the elastic support body may be configured to be ejectable with a pop-up structure from the display module accommodating part and to be rotatable on a rod configured to support the complex, and the rod may be configured to be movable in a longitudinal direction of the wrist band.

As described above, the flexible display module housing of the present disclosure is configured to have the elastic support body, or the complex of the flexible pad and the elastic support body. Therefore, it is possible to secure strong durability and restoring ability of the flexible display module, and to prevent wrinkle generation even in frequent deformation of the flexible display module bent and unbent.

Furthermore, the flexible display module housing of the present disclosure is configured to secure the durability of the flexible display module and to release the wrinkle generation and the risk of damage. Therefore, a large area display module significantly expanded in comparison to the conventional smartwatch can be realized in the wrist band shape.

The effect of the present disclosure is not limited to the above description, and other effects not mentioned will be clearly understood by those skilled in the art from the subsequent description.

BRIEF DESCRIPTION OF THE DRAWINGS

The above and other objectives, features, and other advantages of the present disclosure will be more clearly understood from the subsequent detailed description when taken in conjunction with the accompanying drawings, in which.

DETAILED DESCRIPTION OF THE INVENTION

Figure 1:
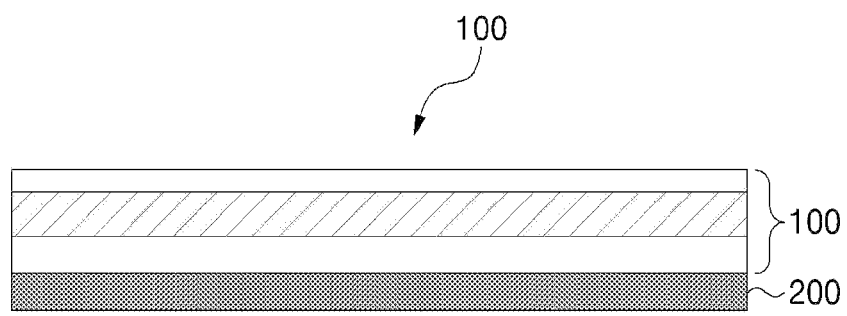
FIG. 1 is a view showing a basic structure of a flexible display module housing according to the present disclosure.

Hereinbelow, an exemplary embodiment of the present disclosure will be described in detail with reference to accompanying. Advantages and features of the present disclosure, and how to achieve them, will become apparent with reference to the embodiments described below in detail with reference to the accompanying drawings. However, various changes to the following embodiments are possible and the scope of the present disclosure is not limited to the following embodiments. The embodiments of the present disclosure are presented to make complete disclosure of the present disclosure and help those who are ordinarily skilled in the art best understand the invention. The present disclosure is only defined by the scope of the claims. Like reference numerals are used to identify like components throughout different drawings.

Unless otherwise defined, all terms including technical and scientific terms used herein have the same meaning as commonly understood by one of ordinary skill in the art to which the present disclosure belongs Terms defined in a dictionary are to be interpreted as having the same meaning as meanings used in the related art, and should not be interpreted ideally or excessively unless this application clearly defines otherwise. The terms used herein are used for the purpose of describing the embodiments and are not intended to limit the present disclosure. As used herein, the singular forms "a", "an", and "the" are intended to include the plural forms as well, unless the context clearly indicates otherwise.

It will be further understood that the terms "comprises" and/or "comprising", or "includes" and/or "including", when used in this specification, specify the presence of stated features, regions, integers, steps, operations, elements and/or components, but do not preclude the presence or addition of one or more other features, regions, integers, steps, operations, elements, components and/or groups thereof.

FIG. 1 is a view showing a basic structure of a flexible display module housing 10 according to the present disclosure.

In comparison with an existing smartwatch, the flexible display module housing 10 of the present disclosure refers to a flexible display module housing 10 having a band shape of which a wider width is wrapped around a portion of the wrist facing the arm, not a portion of the wrist facing the hand. One of technical characteristics of the present disclosure is the flexible display module housing 10 in which a width of a display can be formed more wider in comparison to the conventional smartwatch wrapped only a hand-side wrist.

Therefore, the flexible display module housing 10 of the present disclosure may be a wearable device and provide sufficient environment to search information and view visual content such as movies, while a screen thereof is greatly expanded in comparison to the conventional smartwatch.

However, as the displace screen is largely expanded, disadvantage that the stress acting on a surface of the flexible display module 100 due to repeatedly bent and unbent movement of the flexible display module 100 generates wrinkles on a surface of the flexible display module 100. The wrinkles may be easily generated on a colorless polyimide (CPI) film or an ultra-thin glass (UTG) used in a cover window. The wrinkles on the cover window are not only aesthetically pleasing, but also act as a factor that lowers visibility of the flexible display module, which is an important problem that lowers the commercial value.

Therefore, the flexible display module housing 10 of the present disclosure proposes a way to solve the wrinkle generation problem that frequently occurs in a large area wearable display.

As shown in FIG. 1, the flexible display module housing 10 of the present disclosure includes the flexible display module 100 and an elastic support body 200.

The flexible display module 100 means a flexible module fully equipped with a display function by itself, which includes a flexible display and a driving circuit, and if necessary, including a light source of a backlight. Moreover, the flexible display module may be understood as a concept including a module equipped with a touch screen.

The elastic support body 200 is a plate-shaped support body joined to a lower surface of the flexible display module 100. The elastic support body 200 has an excellent elastic restoring force and maintains an initial shape even with repeated bending. The elastic support body 200 may absorb, by the elastic restoring force, a variety of stress acting on the flexible display module 100 joined on the upper surface of the elastic support body 200, and may prevent the flexible display module 100 from being wrinkled and damaged. Furthermore, the elastic support body 200 serves to endure the ability to restore the flexible display module 100 to the original state thereof.

According to the embodiment of the present disclosure, the elastic support body 200 may be elastic plastic, an elastic metal plate, or an elastic complex of elastic plastic and an elastic metal plate. The elastic plastic refers to plastic with high elasticity, and for example, silicone gel or polyurethane may be applied as the elastic plastic. The elastic metal plate also refers to a metal plate with excellent elastic restoring force, and a titanium plate or a stainless steel plate may be used as the elastic metal plate. The elastic complex may be formed by integrally embedding the elastic metal plate by insertion molding with respect to the elastic plastic, or by concave-convex processing a surface of the elastic metal plate and coupling the elastic plastic to the surface.

Figure 2:
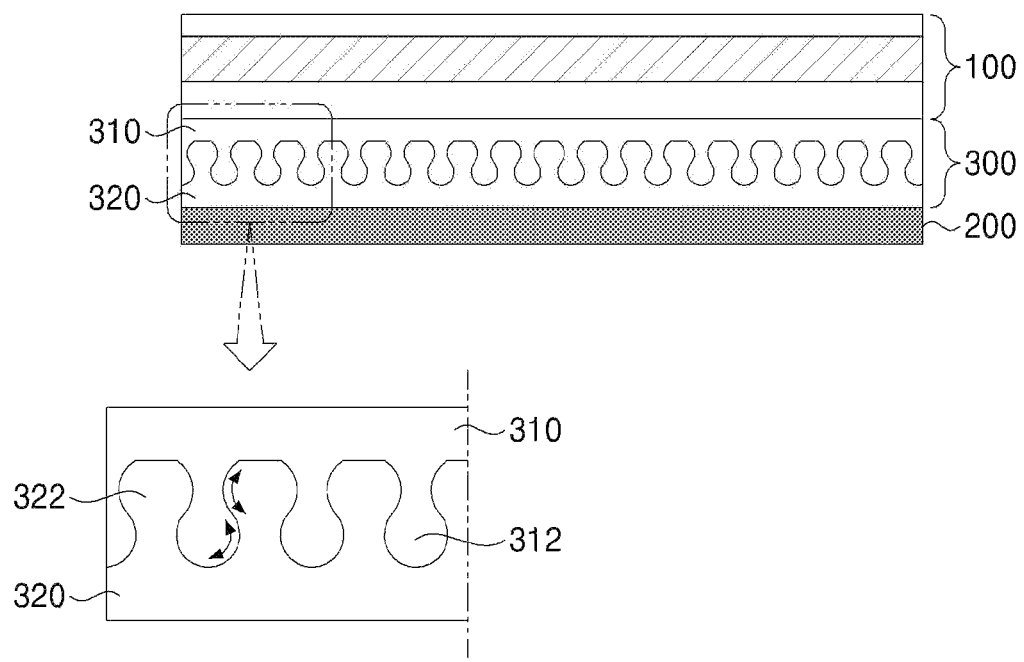
FIG. 2 is a view showing the flexible display module housing of FIG. 1 including a flexible pad.

FIG. 2 is a view showing the flexible display module housing 10 of FIG. 1 including a flexible pad. Referring to FIG. 2, the flexible display module housing includes the flexible pad. The flexible pad of the present disclosure is disposed between the flexible display module 100 and the elastic support body 200 and is joined to both the flexible display module 100 and the elastic support body 200.

The flexible pad consists of a pair of a first flexible pad 310 and a second flexible pad 320. A first uneven portion 312 formed on one surface of the first flexible pad 310 and a second uneven portion 322 formed on one surface of the second flexible pad 320 facing the first flexible pad 310 are tightly engaged as the uneven portions thereof are fitted into each other. The first uneven portion 312 and the second uneven portion 322 are formed in complementary shapes, and the first and second uneven portions 312 and 322 may be formed in a similar dovetail structure, thus the engagement state between the first and second uneven portions 312 and 322 is maintained as a concave surface and a convex surface are coupled to each other.

The first flexible pad 310 is joined to the flexible display module 100 and the second flexible pad 320 is joined to the elastic support body 200. The first and second flexible pads 310 and 320 are engaged with each other as the uneven portions 312 and 322 in complementary shapes are fitted into each other, whereby the flexible display module 100 and the elastic support body 200 are connected to each other. The flexible display module 100 and the elastic support body 200 may not be directly joined depending on their physical properties. In this case, the flexible pad serves to act a medium mediating the connection between the flexible display module 100 and the elastic support body 200.

Relative sliding movement may be performed on contact surfaces between the first uneven portion 312 and the second uneven portion 322. The sliding movement performed in the flexible pad may be caused by a flexible movement of the flexible display module 100 bent and unbent. The sliding movement performed between the first uneven portion 312 and the second uneven portion 322 absorbs a stress acting on the flexible display module 100 and serves to restrain the wrinkle generation.

Preferably, the rigidity of the flexible pad is smaller than the rigidity of the elastic support body 200. A double step absorption operation, in which the first flexible pad 310 directly joined to the flexible display module 100 and the second flexible pad 320 engaged to the first flexible pad 310 are deformed first and then the elastic support body 200 is deformed, may be efficient. Furthermore, since the elastic support body 200 with the strong rigidity provides a strong elastic restoring force to the second flexible pad 320 joined to the elastic support body 200, the performance of the entire flexible pad may be maintained for a long time.

Figure 3:
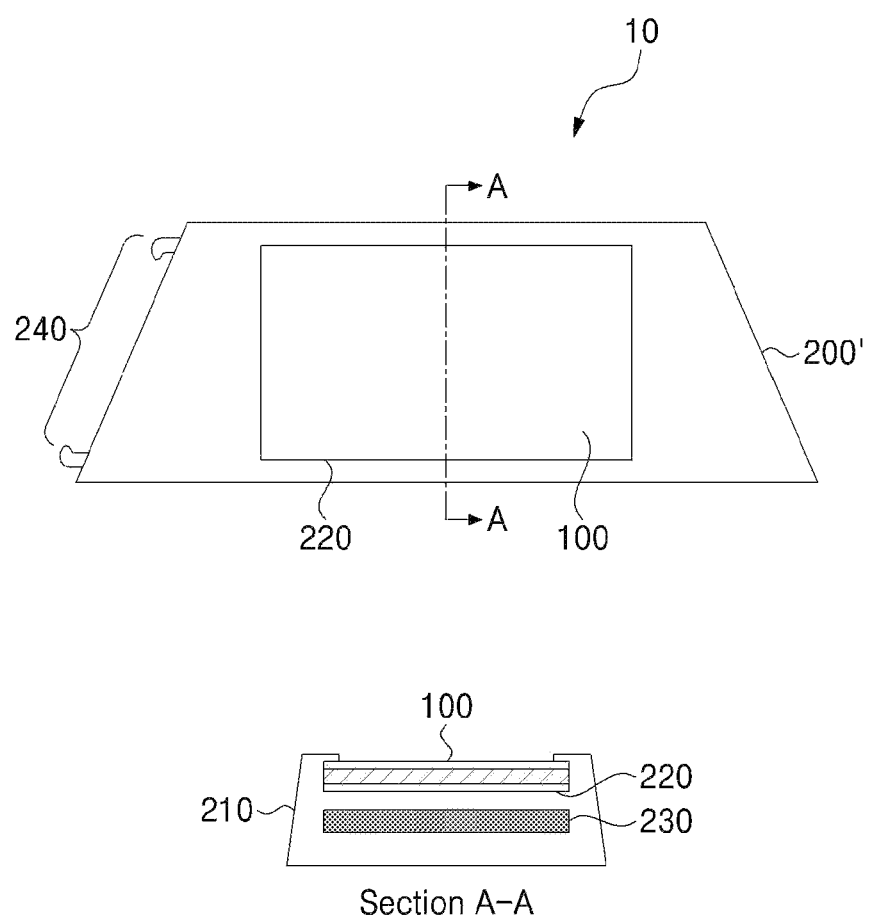
FIG. 3 is a view showing a flexible display module housing according to an embodiment of the present disclosure.

FIG. 3 is a view showing the flexible display module housing 10 according to an embodiment of the present disclosure. The embodiment shown in FIG. 3 is characterized in that the function and role of the elastic support body 200 are realized as the elastic support body 200' formed in a wrist band shape.

Referring to FIG. 3, the elastic support body 200' includes a housing body 210 formed in the wrist band shape in which coupling parts 240 are respectively provided at opposite ends of the housing body 210. The coupling parts 240 provided at the opposite ends of the housing body 210 formed in the wrist band shape are configured to maintain the housing body 210 to be wrapped around a wrist. For example, the coupling parts 240 may include the known configuration such as Velcro, magnets, hooks, and clasps.

Preferably, the housing body 210 may have a trapezoidal shape of which the length of an edge facing the arm (lower edge in the drawing) is longer than the length of an edge facing the hand (upper edge opposite to lower edge in the drawing). The trapezoidal shape of the housing body 210 is a result of reflecting an anatomical feature of the wrist that is gradually thicker from the wrist to the elbow. The trapezoidal shape may improve adhesion on the wrist and comfort of wearing of the housing body 210.

The housing body 210 is made of elastic plastic. The housing body 210 includes an elastic metal plate 230 embedded by insertion molding below a display module accommodating part 220 of the housing body 210. The flexible display module 100 is joined into the display module accommodating part 220.

As described above, as shown in FIG. 3, the elastic support body 200' of the structure in which the elastic metal plate 230 is embedded below the display module accommodating part 220 may correspond to the structure of the elastic complex in which the elastic metal plate is integrally embedded in the elastic plastic by insertion molding shown in FIG. 1.

The embodiment shown in FIG. 3 may be understood such that the elastic plastic has a form of the housing body 210 including the display module accommodating part 220. Similarly, plastic with high elasticity, for example, may be silicone gel or polyurethane, etc., and the elastic metal plate may be a titanium thin plate.

Figure 4:
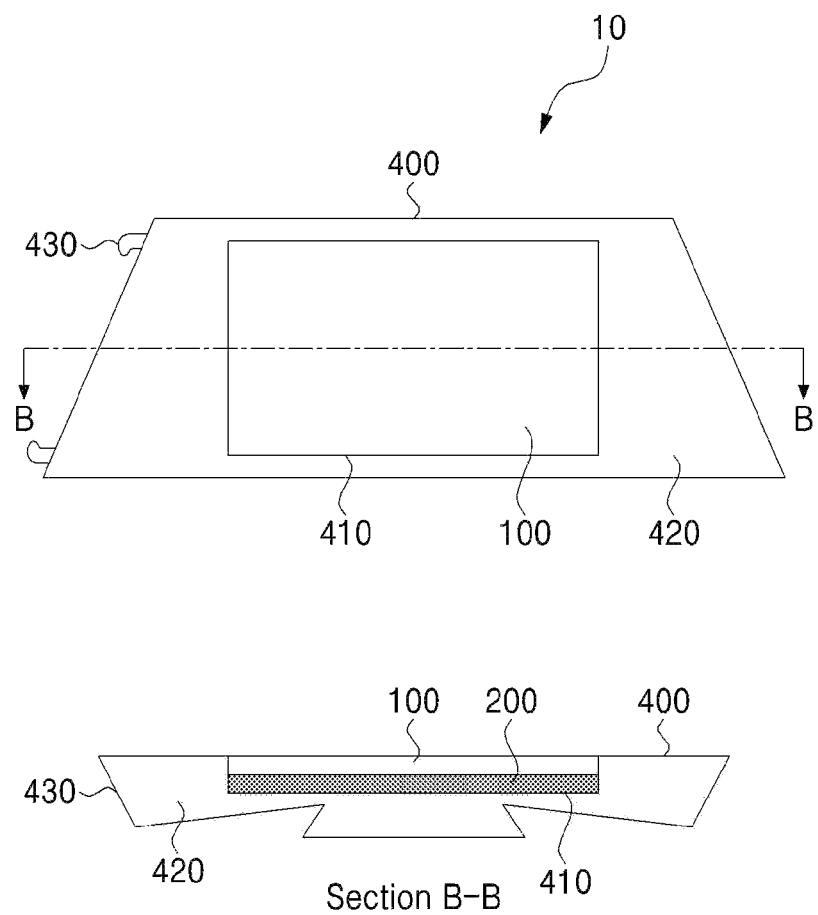
FIG. 4 is a view showing a flexible display module housing according to another embodiment of the present disclosure.

FIG. 4 is a view showing a flexible display module housing 10 according to another embodiment of the present disclosure. Although the embodiment of FIG. 4 is similar to the embodiment of FIG. 3 as the exterior, the embodiment of FIG. 4 has a clear difference in the aspect of not including the housing body 210 as the elastic support body 200', but including a separate wrist band 400 independent from the elastic support body 200.

Referring to FIG. 4, the wrist band 400 includes a display module accommodating part 410, and the flexible display module 100 and the elastic support body 200 joined to the lower surface of the flexible display module 100 form a single complex and then the complex is seated in the display module accommodating part 410. In the embodiment of FIG. 4, the complex of the flexible display module 100 and the elastic support body 200 is not joined to the display module accommodating part 410.

The wrist band 400 has coupling parts 430 at opposite ends thereof and has a trapezoidal shape of which an edge facing the arm is longer than an edge facing the hand, and the above-described structure corresponds to the embodiment of FIG. 3 described above.

Moreover, in the longitudinal section (B-B section) of the wrist band 400 in FIG. 4, the thickness of a band part connecting the display module accommodating part 410 to the coupling parts 430 is formed thinner than the thicknesses of the display module accommodating part 410 and the coupling parts 430. The thickness structure is a structure created based on an ideas that the display module accommodating part 410 at the center and the coupling parts 430 at the opposite ends are arranged at flat portions in the front and rear of the wrist, and does not need to be curved.

Furthermore, the longitudinal thickness structure of the wrist band 400 is created considering of efficiency arrangement of various electrical and electronic components. As the thickness of the wrist band 400 is differentiated, rigid components including a rigid circuit board, a rigid battery (general battery), a rigid camera, and a rigid antenna are mounted in areas of the display module accommodating part 410 and the coupling parts 430 that are thick and hardly deformed. On the other hand, the band part with thin thickness and large deformation may be designed to accommodate various flexible components including a flexible cable, a flexible circuit board, a flexible battery, and a flexible antenna.

Figure 5:
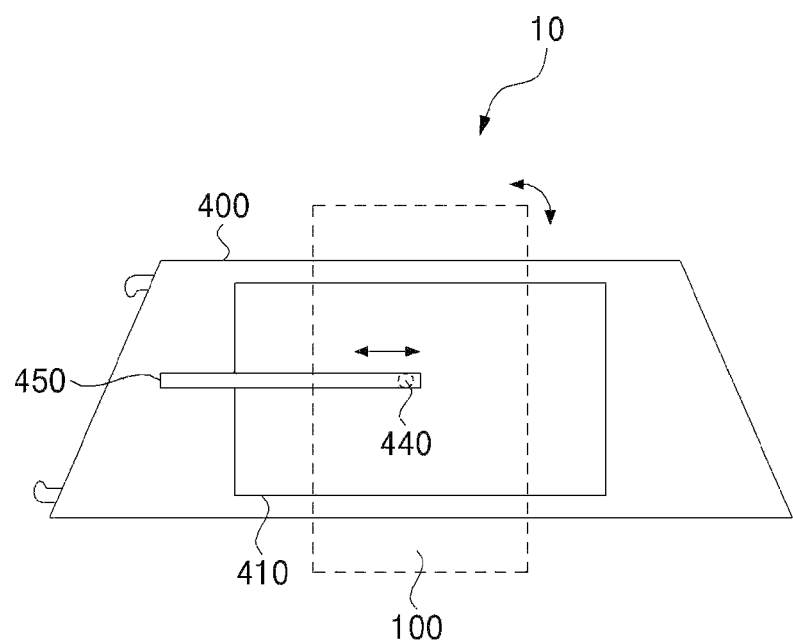
FIG. 5 is a view schematically showing the flexible display module of FIG. 4 ejected with a pop-up structure.

FIG. 5 is a view schematically showing the flexible display module 100 of FIG. 4 ejected with a pop-up structure.

As described above, in the embodiment of FIG. 4, the complex of the flexible display module 100 and the elastic support body 200 (hereinbelow, which refers to "flexible display module complex") is not joined to the display module accommodating part 410. This configuration is created considering that the flexible display module complex may be ejected with the pop-up structure from the display module accommodating part 410.

The configuration of the flexible display module complex ejectable with the pop-up structure from the display module accommodating part 410 means that the posture of the flexible display module complex is changed to a flat unfolded state and the flexible display module complex is ejected by a predetermined height, when the engagement state of the flexible display module complex located inside the display module accommodating part 410 in a bent state is released. The pop-up structure of the flexible display was disclosed in detail in Patent Document 1, which is a prior registered patent of the applicant.

Furthermore, the flexible display module complex unfolded flat while being ejected with the pop-up structure may be rotated around a rod 440 supporting the flexible display module complex. As the rod 440 is moved along a groove 450 formed in the wrist band 400 in a longitudinal direction, the location of the flexible display module complex may be changed.

The rotation and movement structure of the flexible display module complex is provided for a user wearing the wrist band 400 to freely adjust a direction of the screen of the flexible display in response to an angle of an arm and view of the user. The configuration about this rotation and movement structure was disclosed in detail in Patent Document 1, and the contents thereof will be referenced.

Although the preferred embodiments of the present disclosure have been described with reference to the accompanying drawings, those skilled in the art will appreciate that various modifications, additions and substitutions are possible, without departing from the scope and spirit of the invention as disclosed in the accompanying claims. Therefore, it should be understood that the embodiments described above are illustrative in all respects and not restrictive.

What is claimed is:

1. A flexible display module housing comprising:
   a flexible display module;
   an elastic support body joined to a lower surface of the flexible display module and configured to absorb a stress acting on the flexible display module and to restore the flexible display module to an original state of the flexible display module, and
   a flexible pad disposed between the flexible display module and the elastic support body and joined to both the flexible display module and the elastic support body,
   wherein,
   the flexible pad comprises a first flexible pad and a second flexible pad,
   a first uneven portion is formed on one surface of the first flexible pad and a second uneven portion is formed on one surface of the second flexible pad,
   the first flexible pad and the second flexible pad are engaged with each other as concave and convex surfaces of a dovetail structure of the first uneven portion and the second uneven portion.

2. The flexible display module housing of claim 1, wherein the elastic support body is elastic plastic, an elastic metal plate, or an elastic complex generated of elastic plastic and an elastic metal plate coupled to each other.

3. The flexible display module housing of claim 1, wherein relative movement is possible in a sliding manner on contact surfaces between the first uneven portion and the second uneven portion.

4. The flexible display module housing of claim 1, wherein the rigidity of the flexible pad is lower than that of the elastic support body.

5. A flexible display module housing comprising:
   a flexible display module;
   an elastic support body joined to a lower surface of the flexible display module and configured to absorb a stress acting on the flexible display module and to restore the flexible display module to an original state thereof; and
   a wrist band comprising a display module accommodating part accommodating, therein, both the flexible display module and the elastic support body joined to the lower surface of the flexible display module,
   wherein,
   the wrist band has coupling parts at opposite ends thereof,
   the wrist band is configured such that an upper surface of the flexible display module and a surface of the coupling parts form a continuous flat surface, and
   a thickness of a band part connecting the display module accommodating part to the coupling parts is formed thinner than thicknesses of the display module accommodating part and the coupling parts.

6. The flexible display module housing of claim 5, wherein the wrist band has a trapezoidal shape of which an edge facing the arm is longer than an edge facing the hand.

7. The flexible display module housing of claim 6, wherein rigid components including a rigid circuit board, a rigid battery, a rigid camera, and a rigid antenna are mounted in areas of the display module accommodating part and the coupling parts, and flexible components including a flexible cable, a flexible circuit board, a flexible battery, and a flexible antenna are mounted in the band part.

8. The flexible display module housing of claim 6, wherein a complex of the flexible display module and the elastic support body is configured to be ejectable with a pop-up structure from the display module accommodating part and to be rotatable on a rod configured to support the complex, and the rod is configured to be movable in a longitudinal direction of the wrist band.

* * * * *